(12) United States Patent
Hattori et al.

(10) Patent No.: US 7,327,004 B2
(45) Date of Patent: Feb. 5, 2008

(54) SENSOR DEVICE

(75) Inventors: Koji Hattori, Tokyo (JP); Takao Yoneyama, Anpachi-gun (JP); Ryuichiro Abe, Ichinomiya (JP); Minekazu Sakai, Kariya (JP); Shigenori Yamauchi, Nisshin (JP)

(73) Assignee: DENSO CORPORATION, Kariya (JP)

( * ) Notice: Subject to any disclaimer, the term of this patent is extended or adjusted under 35 U.S.C. 154(b) by 54 days.

(21) Appl. No.: 11/294,580

(22) Filed: Dec. 6, 2005

(65) Prior Publication Data

US 2006/0097331 A1    May 11, 2006

(30) Foreign Application Priority Data

Dec. 6, 2004   (JP) .............................. 2004-352741
Sep. 26, 2005  (JP) .............................. 2005-277696

(51) Int. Cl.
*H01L 29/84* (2006.01)

(52) U.S. Cl. ................ 257/415; 257/777; 257/E27.122

(58) Field of Classification Search ................ 257/415
See application file for complete search history.

(56) References Cited

U.S. PATENT DOCUMENTS 6,316,840 B1 * 11/2001 Otani ......................... 257/787
6,522,015 B1 *  2/2003 Glenn et al. ................. 257/777
7,009,302 B2 *  3/2006 Tao ............................. 257/777
2004/0182157 A1  9/2004 Sakai et al.

OTHER PUBLICATIONS

U.S. Appl. No. 11/281,449, filed Nov. 18, 2005, Tanaka et al.

* cited by examiner

*Primary Examiner*—Tu-Tu Ho
(74) *Attorney, Agent, or Firm*—Posz Law Group, PLC

(57) ABSTRACT

A sensor device includes a sensor chip having a movable portion on one surface, a circuit chip laminated with the sensor chip to be opposite to the movable portion of the sensor chip, and a bump located between the sensor chip and the circuit chip. In the sensor device, the sensor chip and the circuit chip are electrically connected through the bump, and the movable portion of the sensor chip is separated from the circuit chip by a space using the bump. Accordingly, it can effectively restrict parasitic capacity of an electric connecting portion between both the chips from being changed by an impact. For example, the sensor device can be used as an angular velocity sensor device having a vibrator as the movable portion.

20 Claims, 7 Drawing Sheets

SENSOR DEVICE

CROSS REFERENCE TO RELATED APPLICATION

This application is based on Japanese Patent Applications No. 2004-352741 filed on Dec. 6, 2004, and No. 2005-277696 filed on Sep. 26, 2005, the contents of which are incorporated herein by reference in its entirety.

FIELD OF THE INVENTION

The present invention relates to a sensor device in which a sensor chip having a movable portion as a sensing portion on one surface and a circuit chip are laminated, and both the chips are electrically connected. In particular, the present invention relates to a sensor device for detecting a dynamic amount such as angular velocity, acceleration, etc. by a movable portion.

BACKGROUND OF THE INVENTION

In a sensor device having a sensor chip, in which a movable portion displaced by a dynamic amount such as acceleration, angular velocity or pressure, etc. is formed on one surface side of a semiconductor substrate.

For example, an angular velocity sensor having a vibrator constructed with a beam structural body having a comb teeth shape, an acceleration sensor (e.g., JP-A-2004-286615) having a movable electrode and a fixing electrode constructed with a beam structural body having a comb teeth shape, a pressure sensor having a semiconductor diaphragm, etc. are proposed as such a sensor device.

Here, in such a sensor device, the circuit chip constructed with an IC chip separated from the sensor chip, etc. is arranged for the purpose of processing of a signal outputted from the sensor chip, etc. In this case, a stack structure for laminating the sensor chip and the circuit chip and for electrically connecting both these chips is adopted to make the body of the sensor device compact.

In a sensor device shown in FIG. 15, a circuit chip 200 is fixed to an interior of a package 300 sealed by a cover portion 320, through an adhesive 1. A sensor chip 100 is fixed onto this circuit chip 200 through an adhesive sheet 2, etc.

A movable portion 20 as a sensor element, (i.e., a sensing portion) is formed on an upper surface of the sensor chip 100. Then, the sensor chip 100 and the circuit chip 200, and the circuit chip 200 and the package 300 are electrically connected using wires 3 through wire bonding.

However, as shown in FIG. 15, in this sensor device, the sensor chip 100 and the circuit chip 200 are electrically connected through the wire 3. Therefore, the wire 3 as this electrical connecting portion is easily deformed by an impact applied from the exterior to the sensor device.

When the wire 3 is deformed in this way, a sensor output outputted from the sensor device is influenced by the change of parasitic capacity due to the deformation of this wire 3, and is easily changed.

Further, when foreign matters existing within the package 300 are moved and are attached to the movable portion 20 by the application of the impact, there are problems in that movable characteristics of the movable portion 20 are obstructed and no preferable sensor characteristics are obtained.

SUMMARY OF THE INVENTION

In view of the above-described problems, it is an object of the present invention to effectively restrict parasitic capacity of an electric connecting portion of two chips from being changed by an impact, etc. in a sensor device constructed by laminating a sensor chip having a movable portion on one surface and a circuit chip and electrically connecting both the chips.

According to an aspect of the present invention, a sensor device includes a sensor chip having a movable portion on one surface, a circuit chip laminated with the sensor chip to be opposite to the movable portion of the sensor chip, and a bump located between the sensor chip and the circuit chip. In the sensor device, the sensor chip and the circuit chip are electrically connected through the bump, and the movable portion of the sensor chip is separated from the circuit chip by a space using the bump.

Because a predetermined space can be formed between both the chips by using the bump, the movable portion can be easily separated from the circuit chip. Therefore, the movable portion used as a sensing portion can be suitably operated. Further, both the chips are electrically connected through the bump, a deformation of an electrical connection portion between both the chips can be restricted, thereby effectively restrict a variation in parasitic capacity of the electric connection portion due to an impact.

For example, an adhesive member having an electric insulating property can be arranged between the sensor chip and the circuit chip, for bonding both the sensor chip and the circuit chip. Even in this case, the adhesive member is arranged to be separated from the movable portion of the sensor chip. Therefore, a mechanical strength between both the chips can be effectively increased while the movable portion can be suitably operated.

The adhesive member can be arranged around the bump to seal the bump. Alternatively, the adhesive member can be arranged to surround the movable portion between the sensor chip and the circuit chip. In this case, the movable portion positioned at an inner peripheral side of the adhesive member is sealed by the adhesive member.

Furthermore, the adhesive member can be constructed with an adhesive film. In this case, the adhesive film has a first portion opposite to the movable portion and a second portion positioned outside from the first portion, and the first portion of the adhesive film is made thinner than the second portion of the adhesive film to form a concave portion recessed from a surface on a side the movable portion. Alternatively, the adhesive film has a convex portion protruding in a direction separating from the movable portion.

In addition, the adhesive member can be provided to form a seal portion for sealing the movable portion around the movable portion, and a coating member can be provided to cover the seal portion. In this case, the movable portion can be tightly sealed.

In the present invention, the bump can be provided with a plurality of bump parts which are separately arranged around the movable portion. In this case, the bump parts can be located in an area where the adhesive member is arranged, or can be arranged outside of the bump parts to surround the bump parts. Furthermore, the adhesive member can be provided with a plurality of adhesive parts which are arranged around the movable portion. In this case, the adhesive parts can be arranged to surround the bump parts, or can be arranged at positions different from the bump parts.

BRIEF DESCRIPTION OF THE DRAWINGS

The above and other objects, features and advantages of the present invention will become more apparent from the following detailed description of preferred embodiments made with reference to the accompanying drawings, in which.

DETAILED DESCRIPTION OF PREFERRED EMBODIMENTS

First Embodiment

Figure 1:
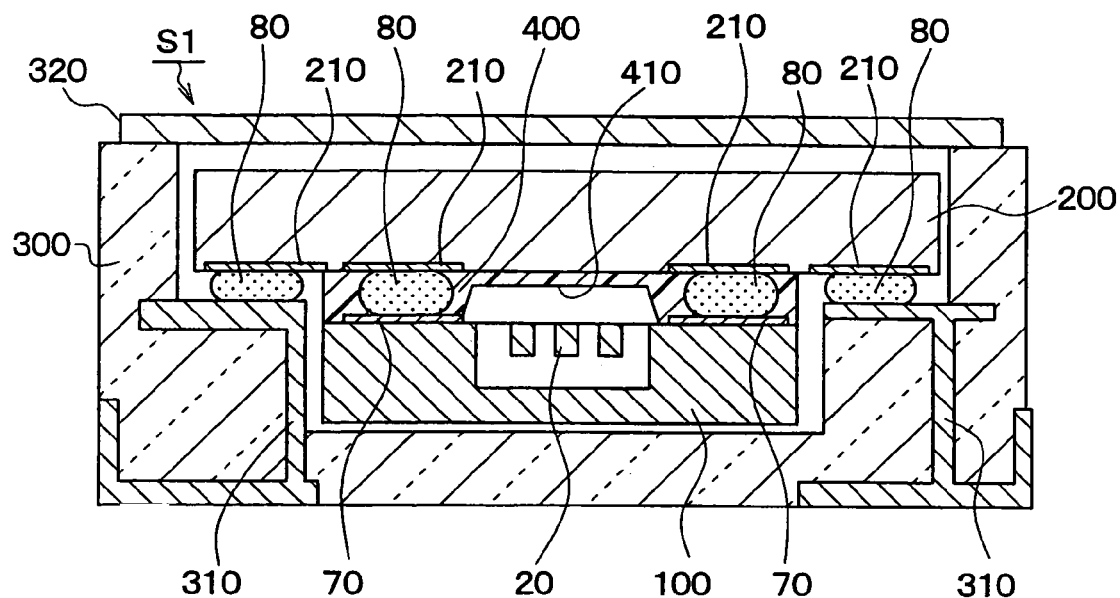
FIG. 1 is a schematic sectional view of an angular velocity sensor device as a sensor device in accordance with a first embodiment of the present invention.
Figure 2:
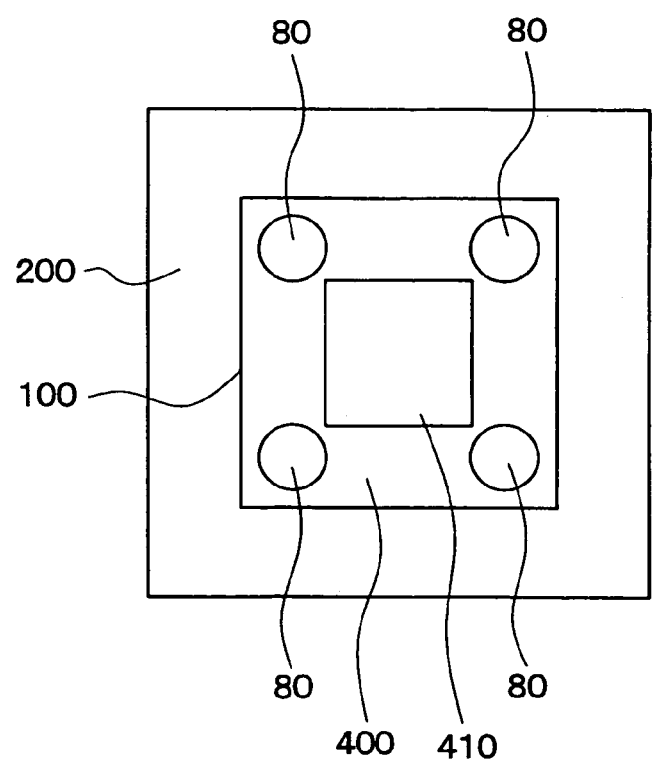
FIG. 2 is a schematic plan view showing the surface structure on a bump side of a circuit chip in the angular velocity sensor device shown in FIG. 1.
Figure 3:
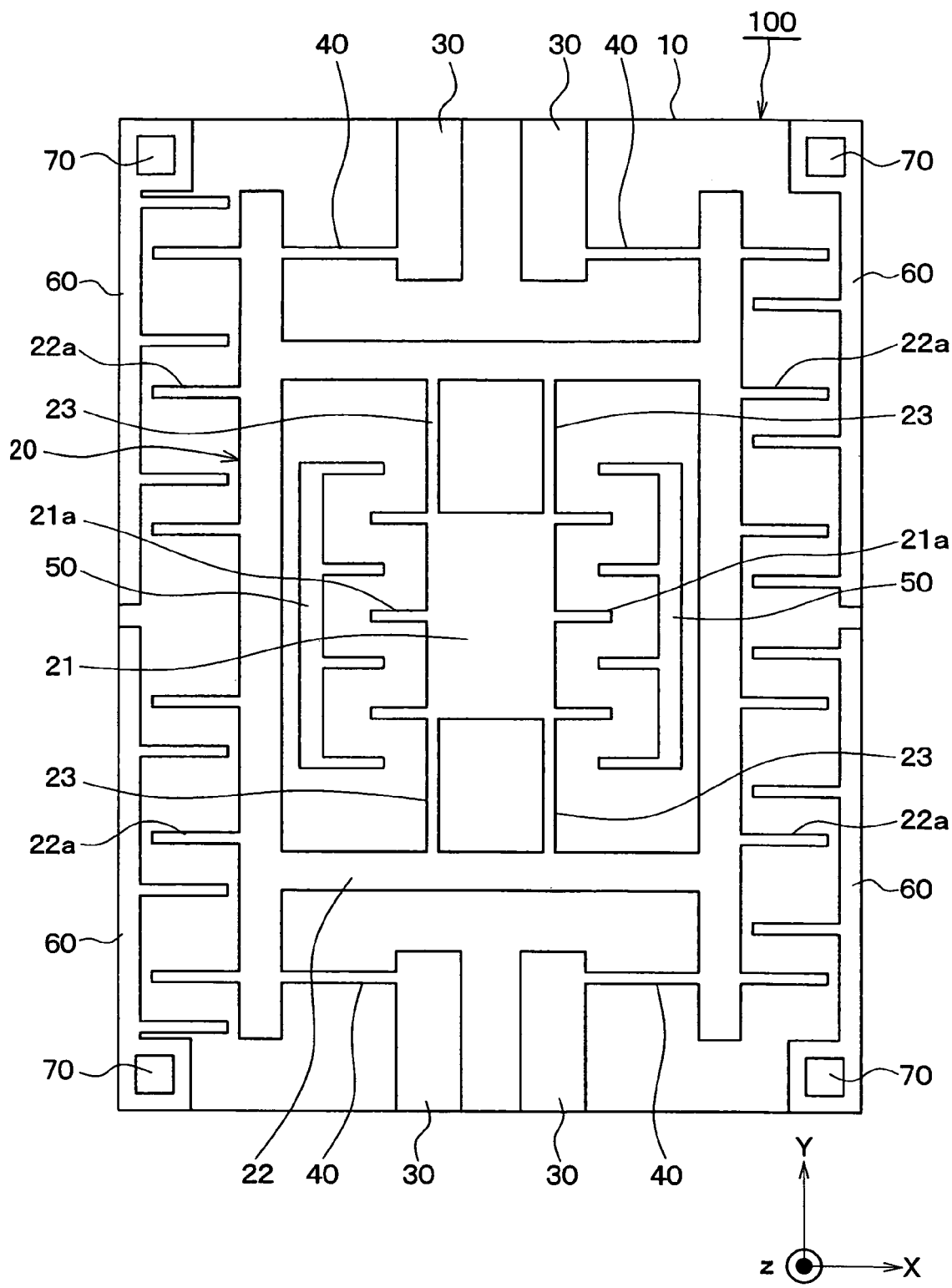
FIG. 3 is a schematic plan view of an angular velocity detecting element in the angular velocity sensor device shown in FIG. 1.

FIG. 1 is a view showing an entire structure of an angular velocity sensor device S1 as a sensor device in accordance with the first embodiment of the present invention. FIG. 2 is a schematic plan view showing a surface structure of a circuit chip 200 having bumps 80 in the angular velocity sensor device S1 shown in FIG. 1 in a transmitting state of a sensor chip 100. FIG. 3 is a view showing a schematic planar structure of an angular velocity detecting element 100 in the angular velocity sensor device S1 shown in FIG. 1 when being viewed from the upper surface of a substrate 10 constituting this element 100.

As shown in FIG. 1, the angular velocity sensor device S1 of this embodiment is generally formed by arranging the angular velocity detecting element 100 as the sensor chip, the circuit chip 200, and a package 300 for accommodating the angular velocity detecting element 100 and the circuit chip 200.

First, the angular velocity detecting element 100 will be mainly explained with reference to FIG. 3. The angular velocity detecting element 100 has the substrate 10 such as a semiconductor substrate, etc., and is formed by performing generally known micro machine process with respect to this substrate 10.

For example, a SOI (Silicon-On-Insulator) substrate, constructed by sticking a second silicon layer as a second semiconductor layer onto a first silicon layer as a first semiconductor layer through an oxide film as an insulating layer, can be adopted as the substrate 10.

As shown in FIG. 3, beam structural bodies 20 to 60 partitioned by grooves are formed by performing trench etching and release etching, etc. with respect to a surface layer of this substrate 10, e.g., the second silicon layer in the SOI substrate.

These beam structural bodies 20 to 60 are generally constructed with a vibrator 20 as a sensing portion for performing sensing, i.e., a movable portion, respective beam portions 23, 40 and respective electrodes 50, 60.

The vibrator 20 is formed in the central portion of the substrate 10 so as to be vibrated on a surface horizontal with respect to the substrate 10, i.e., on the paper surface within FIG. 3. In this example, the vibrator 20 is constructed with a first vibrating portion 21 having an approximately rectangular shape located in the central portion, a second vibrating portion 22 having a rectangular frame shape located in the outer circumference of this first vibrating portion 21, and a driving beam portion 23 for connecting these first and second vibrating portions 21, 22.

This vibrator 20 is connected to an anchor portion 30 arranged in a circumferential portion of the substrate 10, through a detecting beam portion 40. Here, the anchor portion 30 is fixed and supported by the lower portion of the surface layer forming the beam structural body 20 therein within the substrate 10, i.e., by a support substrate portion. The vibrator 20 is floated from this support substrate portion.

Here, as shown in FIG. 3, the driving beam portion 23 can be elastically deformed substantially in only the x-direction by forming this driving beam portion 23 in a shape extending in e.g., the y-direction. The detecting beam portion 40 can be elastically deformed substantially in only the y-direction by forming this detecting beam portion 40 in a shape extending in e.g., the x-direction.

The first vibration portion within the vibrator 20 can be vibrated by the driving beam portion 23 in the x-direction (driving vibrating direction) within a plane horizontal with respect to the substrate 10. On the other hand, the entire vibrator 20 can be vibrated by the detecting beam portion 40 in the y-direction (detecting vibrating direction) within the plane horizontal with respect to the substrate 10.

A driving electrode 50 for operating and vibrating the first vibrating portion 21 in the x-direction is arranged between the first vibrating portion 21 and the second vibrating portion 22.

Similarly to the anchor portion 30, this driving electrode 50 is fixed to the above support substrate portion. The driving electrode 50 is arranged so as to be opposed to a comb teeth portion (comb teeth portion for driving) 21a projected from the first vibrating portion 21 such that the comb teeth are engaged with each other.

A detecting electrode 60 for detecting angular velocity is arranged in the outer circumference of the second vibrating portion 22.

This detecting electrode 60 is arranged to detect the angular velocity around the z-axis perpendicular to the substrate 10 on the basis of the vibration of the vibrator 20. Similarly to the anchor portion 30, the detecting electrode 60 is fixed to the above support substrate portion. The detecting electrode 60 is arranged so as to be opposed to a comb teeth portion (comb teeth portion for detection) 22a projected from the second vibrating portion 22 such that the comb teeth are engaged with each other.

Further, pads 70 (see FIG. 1) for applying voltages to the above vibrator 20, the driving electrode 50, the detecting electrode 60, etc. and for taking-out a signal are arranged in a suitable place of the upper surface of the substrate 10 in this angular velocity detecting element 100. The pads 70 for the detecting electrode 60 are shown in FIG. 3.

As shown in FIGS. 1 and 3, the pads 70 are arranged in the circumferential portion of the substrate 10, and such a pad is formed from aluminum, etc. As shown in FIG. 1, the bumps 80 each of which is formed from an Au (gold) bump, a solder bump, etc. are connected to the pads 70, respectively.

This bump 80 can be formed by adopting various kinds of methods such as a forming method of a general stud bump, a forming method of a solder bump, screen printing using conductor paste of Au, etc., or printing using an ink jet method using nano paste of Au, etc.

Thus, as shown in FIG. 1, the angular velocity detecting element 100 as the sensor chip is laminated with the circuit chip 200 through the bumps 80 in a state in which the vibrator 20 as the movable portion is opposed to the circuit chip 200. The angular velocity detecting element 100 and the circuit chip 200 are electrically connected by the bumps 80.

Here, as shown in FIG. 1, the pads 70 of the angular velocity detecting element 100 and pads 210 of the circuit chip 200 are connected through the bumps 80, respectively. In this angular velocity sensor device S1, the interval between the sensor chip 100 and the circuit chip 200 (i.e., the height between both these chips) can be secured by the bumps 80. Therefore, the vibrator 20 and the circuit chip 200 can be separated from each other.

In this circuit chip 200, for example, a MOS transistor, a bipolar transistor, etc. are formed by using a publicly known semiconductor process with respect to a silicon substrate, etc. Therefore, it is possible to set this circuit chip 200 to have a function for sending a voltage, etc. for operating the vibrator 20 to the angular velocity detecting element 100, and supplying an electric signal sent from the angular velocity detecting element 100 in processing of conversion, amplification, etc. and outputting this electric signal to the exterior, etc.

As shown in FIG. 1, this circuit chip 200 can be electrically and mechanically connected to the package 300 through the bump 80.

Here, as shown in FIG. 1, the package 300 of this embodiment has wiring 310 constructed with a conductor material in the interior or on the surface of the package 300. The material of the package 300 is not particularly limited, but can be constructed by ceramic, resin, etc.

For example, this package 300 can be constructed as a ceramic laminating wiring substrate in which plural ceramic layers of alumina, etc. are laminated. In such a laminating wiring substrate, the above wiring 310 is formed between the respective layers, and each wiring 310 is conducted by a through hole, etc.

As shown in FIG. 1, the pads 210 of the circuit substrate 200 and the above wiring 310 located on the surface of the package 300 are electrically and mechanically connected by bumps 80 similarly to the bumps 80 for connecting both the above chips 100 and 200.

In the example shown in FIG. 1, the wiring 310 is exposed to a step portion arranged within the package 300. The circumferential portion of the circuit chip 200 having a size larger than that of the angular velocity detecting element 100 as the sensor chip is formed in a shape supported by this step portion of the package 300. The pad 210 of the circuit chip 200 and the wiring 310 of the package 300 are connected by using this step portion through the bump 80.

The angular velocity detecting element 100, the circuit chip 200 and the exterior are electrically connected through the bumps 80 and the wiring 310 of the package 300. For example, an output signal from the circuit chip 200 is sent to the exterior through the pumps 80 and the wiring 310 of the package 300.

As shown in FIG. 1, a cover portion (lid) 320 is attached and fixed to an opening portion of the package 300. The interior of the package 300 is sealed by this cover portion 320.

No material of this cover portion 320 is limited to ceramic, resin, a metal, etc. Further, when the cover portion 320 and the package 300 are connected, it is possible to adopt various kinds of joining methods such as adhesion, welding, etc. Nitrogen gas, etc. as an inert gas can be enclosed within the package 300 sealed by the cover portion 320.

Further, as shown in FIGS. 1 and 2, an adhesive member 400 having an electric insulating property for bonding both the angular velocity detecting element 100 as the sensor chip and the circuit chip 200 is arranged between both these chips 100 and 200. The adhesive member 400 is separated from the vibrator 20 as the movable portion of the angular velocity detecting element 100 by a space.

Here, as shown in FIGS. 1 and 2, the adhesive member 400 is arranged around the bumps 80 between the angular velocity detecting element 100 and the circuit chip 200. The bumps 80 are sealed by this adhesive member 400.

In the adhesive member 400, a concave portion 410 (recess portion) depressed from the surface of the vibrator 20 side is formed in a part opposed to the vibrator 20 by forming the part corresponding to the vibrator 20 to be thinner than its circumferential portion. Thus, the adhesive member 400 is separated from the vibrator 20 through the concave portion 410, and both the vibrator 20 and the adhesive member 400 can be set in a noncontact state.

Further, in this example, as shown in FIG. 2, the circumferential portion of the concave portion 410 in the adhesive member 400 surrounds the vibrator 20 as the movable portion between the angular velocity detecting element 100 and the circuit chip 200 and is arranged in a ring shape. The vibrator 20 located in the inner circumference of the adhesive member 400 is sealed by the adhesive member 400 outside this vibrator 20.

In the example shown in FIGS. 1 and 2, the concave portion 410 in the adhesive member 400 is formed in a shape in which a part of the adhesive member 400 is depressed from the surface of the adhesive member 400 on the side of the angular velocity detecting element 100. However, in this embodiment, this concave portion 410 may be also formed to have a through hole extending through the adhesive member 400 in its thickness direction. That is, the concave portion 410 of the adhesive member 400 in this embodiment may be a hollow extending through no adhesive member 400, but also includes the above through hole.

Here, when the concave portion 410 is constructed as the through hole in this way, no adhesive member 400 exists in the part shown as the concave portion 410 in FIG. 2. That is, the adhesive member 400 is partially arranged in a frame shape so as to be arranged in the entire circumference of the circumferential portion of the angular velocity detecting element 100 including the bumps 80.

A material made of resin having an electric insulating property, e.g., polyimide resin, etc. can be adopted as such an adhesive member 400.

For example, a material formed from an adhesive film having a film shape, such as NCF (Non Contactive Film) formed by polyimide, etc., a film formed by a printing method of screen printing, ink jet, etc. using polyimide paste can be adopted as the adhesive member 400.

A manufacturing method of the angular velocity sensor device S1 of this embodiment will next be explained.

First, bumps 80 are formed on the surface opposed to the angular velocity detecting element 100 in the circuit chip 200, and an adhesive member 400 is arranged on the bumps 80. Here, the bumps 80 can be formed by using the above stud bump forming method and the solder bump forming method, the screen printing method or the printing using the ink jet method, etc.

Here, FIGS. 4, 5, 6 and 7A and 7B are views showing various kinds of methods with respect to the arrangement of this adhesive member 400, respectively. One of these methods shown in FIGS. 4 to 6 and FIGS. 7A and 7B may be used in the manufacturing method of this embodiment.

Figure 4:
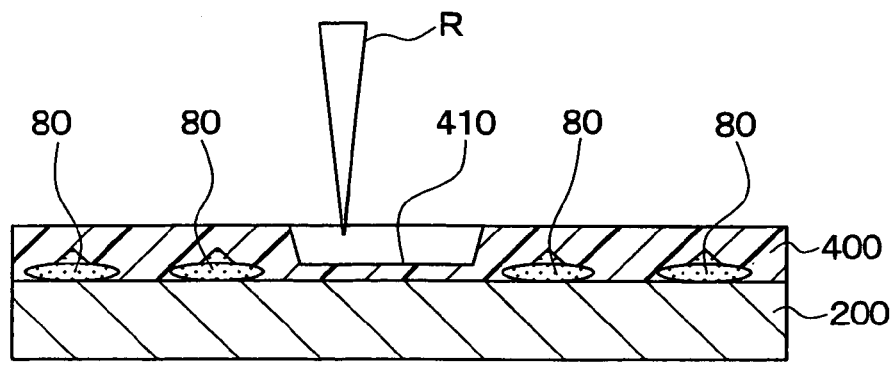
FIG. 4 is a schematic sectional view showing a first method for forming an arrangement structure of an adhesive member.

In a first method shown in FIG. 4, the adhesive member 400 formed from an adhesive film is attached and bonded onto the circuit chip 200 having the bumps 80 thereon. The above concave portion 410 is formed by irradiating a laser beam R and removing a part of the adhesive member 400. Thus, the arrangement of the adhesive member 400 in this method is completed.

As mentioned above, the concave portion 410 of this adhesive member 400 may be also a through hole extending through the adhesive member 400 in its thickness direction, i.e., a through hole reaching until the circuit chip 200. However, when the through hole is formed in this way, there is a possibility that the circuit chip 200 is damaged by irradiating the laser beam R to the circuit chip 200 after the convex portion 41 is formed in this method. Therefore, in this case, it is desirable to set the concave portion 410 in which one portion (bottom portion in FIG. 4) is left without completely extending the concave portion 410 in the adhesive member 400.

Figure 5:
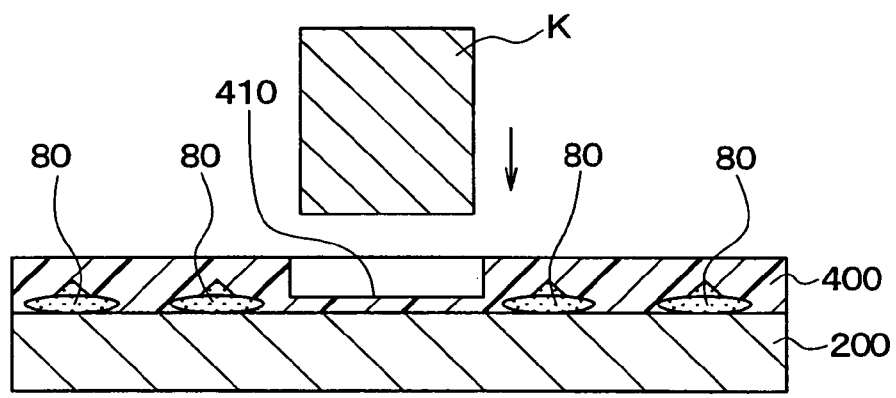
FIG. 5 is a schematic sectional view showing a second method for forming an arrangement structure of the adhesive member.

In a second method shown in FIG. 5, the adhesive member 400 constructed with an adhesive film is bonded onto the circuit chip 200 having the bumps 80 thereon and is deformed by pressing a part of the adhesive member 400 by using a stamp K, and the above concave portion 410 is formed. Thus, the arrangement of the adhesive member 400 in this method can be completed using the pressing.

In the methods shown in FIGS. 4 and 5, the adhesive member 400 arranged on the circuit chip 200 completely covers the bumps 80. However, thereafter, when the angular velocity detecting element 100 is laminated with the circuit chip 200 through the adhesive member 400, the bumps 80 break and penetrate through the adhesive member 400 and comes in contact with the pad 70 of the angular velocity detecting element 100 if the adhesive member 400 is softened by heating, etc.

Figure 6:
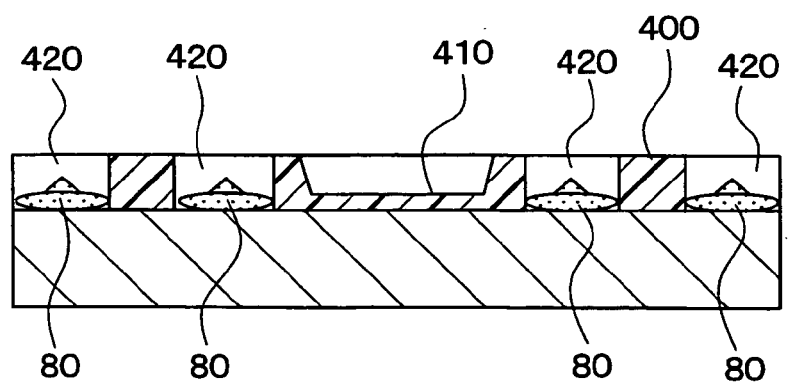
FIG. 6 is a schematic sectional view showing a third method for forming an arrangement structure of the adhesive member.

In a third method shown in FIG. 6, when the angular velocity detecting element 100 is laminated with the circuit chip 200, holes 420 are bored by punching, etc. in parts corresponding to the bumps 80 within the adhesive member 400 constructed with an adhesive film. In this case, it is unnecessary for the bumps 80 to break and penetrate through the adhesive member 400.

The adhesive member 400 in which the holes 420 are formed is stuck onto the circuit chip 200 having the bumps 80 thereon. Thereafter, the above concave portion 410 is formed in the adhesive member 400 by using the above laser and a stamp. Thus, the arrangement of the adhesive member 400 in this method is completed.

Figure 7A:
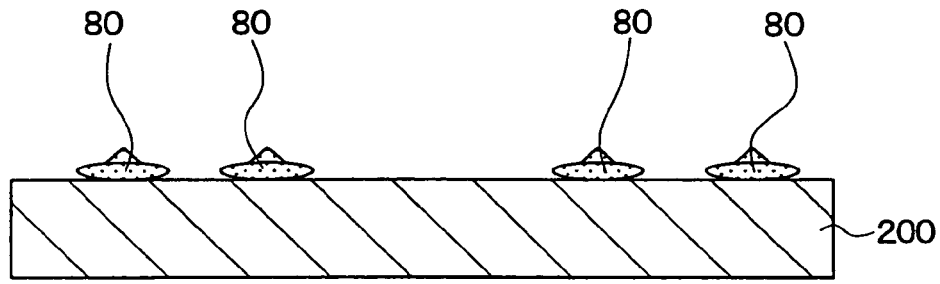
FIGS. 7A and 7B are schematic sectional views showing a fourth method for forming an arrangement structure of the adhesive member.
Figure 7B:
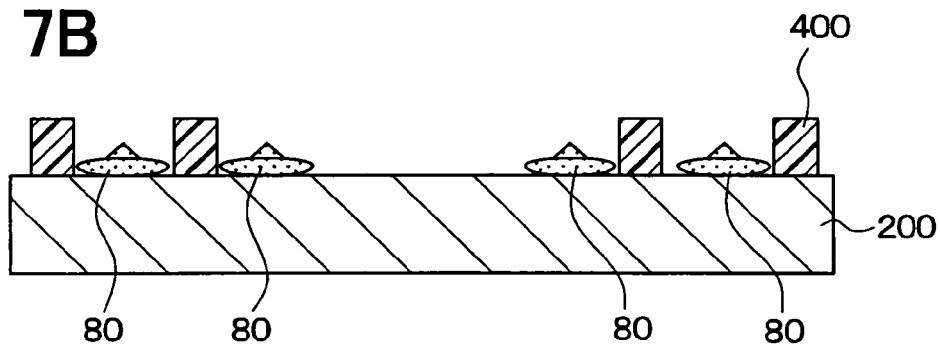

In a fourth method shown in FIGS. 7A and 7B, the adhesive member 400 is formed by a printing method such as a screen printing, an ink jet printing, etc.

In this case, as shown in FIG. 7A, the circuit chip 200 on which the bumps 80 are formed is prepared. Next, as shown in FIG. 7B, printing is selectively performed except for a part constituting the bumps 80 and the above concave portion 410, so as to form the adhesive member 400.

In this embodiment, the adhesive member 400 can be arranged on the bump forming surface in the circuit chip 200 by using the methods represented by FIGS. 4 to 7B, etc.

This adhesive member 400 may be arranged in a chip state, i.e., an independent state of the circuit chip 200, and may be also arranged in a wafer state instead of the chip state, and may be then set to a chip by performing a dicing process.

In each arranging method of the adhesive member 400, it is preferable to set the thickness of the adhesive member 400 to be slightly greater than the height of the bumps 80. This is because a deforming amount of the comparatively soft adhesive member 400 is considered since the contact of each bump 80 is made by mutually pressing both the chips 100, 200 in the laminating layers of both the chips 100, 200 of a subsequent process.

The angular velocity detecting element (sensor chip) 100 is laminated with the circuit chip 200 having the bumps 80 and the adhesive member 400 thereon such that the surface of the angular velocity detecting element 100 on the side of the vibrator 20 is opposed to the circuit chip 200. Both the chips 100, 200 are then mutually pressed.

Thus, as mentioned above, when the bumps 80 are covered with the adhesive member 400, the bumps 80 break and penetrate through the adhesive member 400 and come in contact with the pads 70 of the angular velocity detecting element 100. Otherwise, when the bumps 80 are exposed from the adhesive member 400, this exposed bumps 80 come in contact with the pads 70 of the angular velocity detecting element 100.

Thereafter, the angular velocity detecting element 100 and the circuit chip 200 are electrically connected through the bumps 80 by performing a joining method according to the kind of the bumps 80 as in joining using thermo compression bonding, joining using a reflow, etc.

Further, the angular velocity detecting element 100 and the circuit chip 200 are mechanically joined through the adhesive member 400 together with this electric connection by utilizing an adhesive function of the adhesive member 400 and by utilizing the softening of the adhesive member 400 during the heating at a bump joining time, etc.

Thus, after the angular velocity detecting element 100 and the circuit chip 200 are joined through the bump 80 and the adhesive member 400, both these joined chips 100, 200 are joined to the package 300 through the bump 80 located in the circumferential portion of the outside of the angular velocity detecting element 100 in the circuit chip 200.

Thereafter, the cover portion 320 is attached to the package 300 in a state in which the above nitrogen gas, etc. are enclosed in the interior of the package 300. Thus, the angular velocity sensor device S1 shown in FIG. 1 is completed.

The basic detecting operation of such an angular velocity sensor device S1 will be described as follows with reference to FIGS. 1 and 3.

First, a driving signal (a sine wave voltage, etc.) is applied from the circuit substrate 200 to the driving electrode 50 through the bumps 80, and electrostatic force is generated between the comb teeth portion 21a of the first vibrating portion 21 and the driving electrode 50. Thus, the first vibrating portion 21 is operated and vibrated in the x-direction by the elastic force of the driving beam portion 23.

When angular velocity $\Omega$ is applied around the z-axis under the operating vibration of this first vibrating portion 21, Coriolis force is applied to the first vibrating portion 21 in the y-direction, and the entire vibrator 20 is detected and vibrated in the y-direction by the elastic force of the detecting beam 40.

The capacity between the detecting electrode 60 and the comb teeth of the comb teeth portion 22a for detection is changed by this detecting vibration. Therefore, the magnitude of the angular velocity $\Omega$ can be calculated by detecting this capacity change.

Concretely, in FIG. 3, when the vibrator 20 is displaced in one direction along the y-axis direction, the capacity variations in the detecting electrode 60 of the left-hand side and the detecting electrode 60 of the right-hand side are set to be reverse to each other in the left and right detecting electrodes 60 in FIG. 3. Therefore, the respective capacity variations in the left and right detecting electrodes 60 are converted into voltages, and both the voltage values are differentiated, amplified and outputted so that the angular velocity is calculated.

In accordance with this embodiment, in the angular velocity sensor device S1, the angular velocity detecting element (sensor chip) 100 having the vibrator 20 as the movable portion on one surface and the circuit chip 200 are laminated and both these chips 100, 200 are electrically connected. Furthermore, the angular velocity detecting element 100 is laminated with the circuit chip 200 through the bumps 80 in a state in which its vibrator 20 is opposed to the circuit chip 200. In addition, the chips 100, 200 are electrically connected by the bumps 80, while the vibrator 20 and the circuit chip 200 are separated from each other by the bumps 80.

In accordance with this sensor device S1, the angular velocity detecting element 100 and the circuit chip 200 are laminated in the state in which the vibrator 20 is opposed to the circuit chip 200. Further, because the height between both the chips 100 and 200 is secured through the bumps 80, the vibrator 20 is separated from the circuit chip 200. Therefore, the vibrator 20 can be suitably operated. That is, the sensing portion 20 can be appropriately operated in the sensor device S1 of this embodiment.

Further, both the chips 100 and 200 are electrically connected by the bumps 80. Therefore, the range of deformation due to an impact, etc. is narrow in comparison with an electric connection using a wire as in the conventional case. That is, in this embodiment, since the electric connecting portion using the bumps 80 is constructed, a deformation of this electric connecting portion is restricted.

Accordingly, in accordance with this embodiment, in the sensor device S1 in which the sensor chip 100 having the movable portion 20 on one surface and the circuit chip 200 are laminated and both these chips 100, 200 are electrically connected, it is possible to restrict the parasitic capacity of the electric connecting portion of both the chips 100, 200 from being changed by an impact, etc. as much as possible.

Further, in the angular velocity sensor device S1 of this embodiment, the adhesive member 400 having the electric insulating property for bonding both these chips 100, 200 is arranged between the angular velocity detecting element (sensor chip) 100 and the circuit chip 200, and the adhesive member 400 is separated from the vibrator 20 by a space.

Accordingly, the angular velocity detecting element 100 and the circuit chip 200 are bonded by the adhesive member 400. Therefore, higher mechanical strength can be secured in the joining portion between both the chips 100 and 200, and the deformation of the electric connecting portion between both the chips 100 and 200 can be easily restrained. Further, the vibrator 20 is accurately operated since the adhesive member 400 and the vibrator 20 as the movable portion are separated from each other by a space.

Further, in the adhesive member 400 of the angular velocity sensor device S1 of this embodiment, the concave portion 410 depressed from the surface of the adhesive member 400 on the side of the vibrator 20 is formed by forming the part corresponding to the vibrator 20 to be thinner than its circumferential portion.

In accordance with such a structure, the vibrator 20 and the adhesive member 400 can be appropriately separated from each other. In particular, such a concave portion 410 can be appropriately formed by processing using the above laser and the stamp when an adhesive film is used as the adhesive member 400.

Further, in the angular velocity sensor device S1 of this embodiment, as shown in FIGS. 1 and 2, the adhesive member 400 is arranged around each bump 80 and seals each bump 80 between the sensor chip 100 and the circuit chip 200.

Therefore, the bumps 80 and its circumferential portion can be reinforced by the adhesive member 400. Thus, the strength of the electric connecting portion using the bumps 80 can be improved.

Further, in the angular velocity sensor device S1 of this embodiment, as shown in FIGS. 1 and 2, the adhesive member 400 is arranged so as to surround the vibrator 20 between the angular velocity detecting element 100 and the circuit chip 200, and the vibrator 20 of the inner circumference of the adhesive member 400 is sealed by the adhesive member 400.

Accordingly, the vibrator 20 as the movable portion can be protected from the exterior by sealing the vibrator 20 by the adhesive member 400. Therefore, it is possible to preferably prevent that foreign matters enter the vibrator 20. Thus, it is possible to prevent the disadvantages that the foreign matters are attached to the vibrator 20 and its movable characteristics are obstructed, etc.

Further, in the angular velocity sensor device S1 of this embodiment, a member constructed with an adhesive film of a film shape, and a member constructed with a film formed by a printing method can be adopted as the adhesive member 400.

Figure 8:
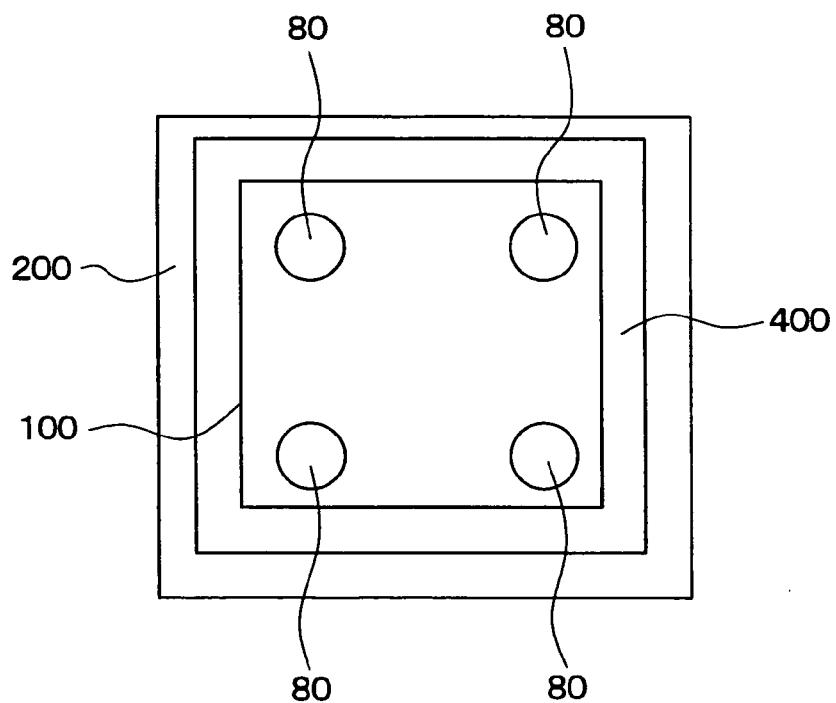
FIG. 8 is a view showing a first modified example of a planar arranging shape of the adhesive member in the above first embodiment.
Figure 9:
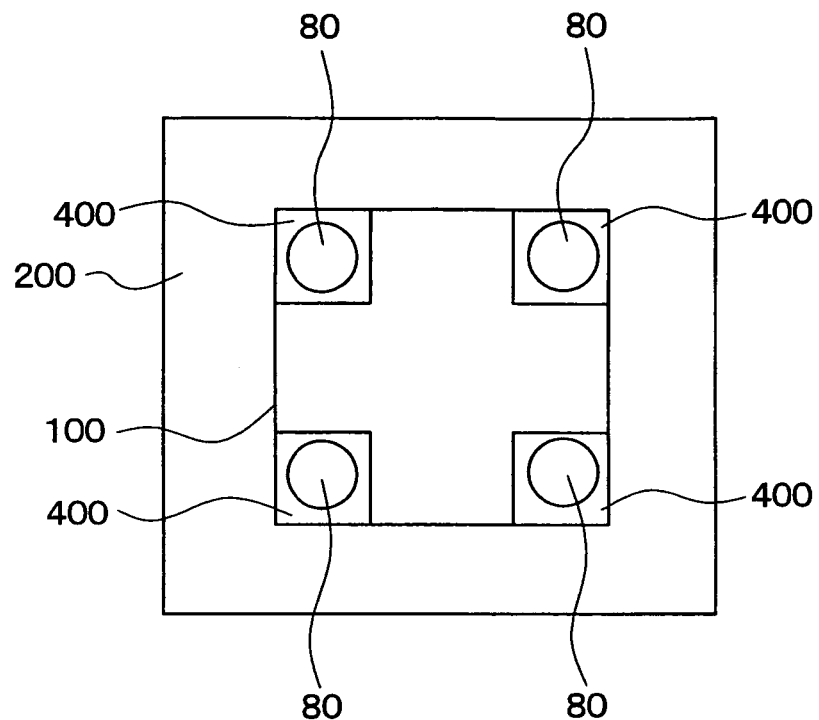
FIG. 9 is a view showing a second modified example of the planar arranging shape of the adhesive member in the above first embodiment.
Figure 10:
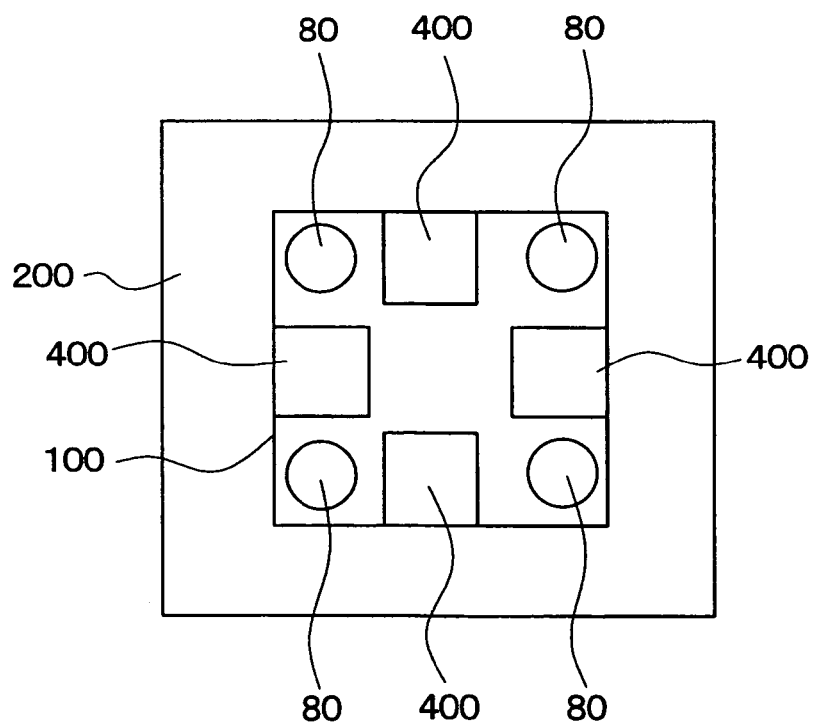
FIG. 10 is a view showing a third modified example of the planar arranging shape of the adhesive member in the above first embodiment.

Next, various modified examples of this embodiment will be described with reference to FIGS. 8, 9, 10, etc. FIGS. 8 to 10 are views showing modified examples of the planar arrangement shape of the adhesive member 400 in the circuit chip 200.

In each of the modified examples shown in FIGS. 8 to 10, the above adhesive member 400 is arranged between the angular velocity detecting element 100 as the sensor chip and the circuit chip 200. Similarly to the example shown in FIGS. 1 and 2, the adhesive member 400 is separated from the vibrator 20 as the movable portion.

Further, similarly to the example shown in FIGS. 1 and 2, higher mechanical strength is secured in the joining of the angular velocity detecting element 100 and the circuit chip 200, and the vibrator 20 is effectively operated by using such an adhesive member 400.

In a first modified example shown in FIG. 8, similarly to the example of FIGS. 1 and 2, the adhesive member 400 is arranged so as to surround the vibrator 20 between the angular velocity detecting element 100 and the circuit chip 200, and the vibrator 20 positioned at the inner circumference of the adhesive member 400 is sealed by the adhesive member 400. However, in this modified example shown in FIG. 8, the adhesive member 400 is arranged in a position dislocated from the bumps 80, and does not directly seal the bump 80.

In the example shown in FIG. 8, the adhesive member 400 is arranged outside the bump 80, but may be also arranged in a position dislocated inside the bump 80 if the adhesive member 400 is arranged so as to surround the vibrator 20.

That is, the example shown in FIG. 8 corresponds to a case in which the concave portion 410 is constructed by a through hole in the adhesive member 400 shown in FIG. 2 and the adhesive member 400 is formed in a frame shape so as to be dislocated from the bumps 80.

In a second modified example shown in FIG. 9, similarly to the example of FIGS. 1 and 2, the adhesive member 400 is arranged around the bumps 80 and seals this bumps 80. However, in this modified example, the adhesive member 400 is arranged only around the bumps 80, and is not arranged to entirely surround the vibrator 20. That is, the adhesive member 400 is partially arranged on the peripheral portion of the sensor chip 100 only around the bumps 80.

In a third modified example shown in FIG. 10, the adhesive member 400 is arranged on the peripheral portion of the sensor chip 100 between the bumps 80, and is arranged in a position dislocated from the bumps 80. Therefore, the adhesive member 400 of this example does not seal the bumps 80 and is also not arranged to entirely surround the vibrator 20.

In the modified examples shown in FIGS. 9 and 10, the vibrator 20 is not sealed by the adhesive member 400. However, these modified examples shown in FIGS. 9 and 10 can be used when there is no fear of invasion of foreign matters so much by the seal structure using the package 300 and the cover portion 320, and the clearance of both the chips 100, 200 is sufficiently small and no foreign matters easily enter the clearance.

However, in the modified examples shown in FIGS. 9 and 10, when there is a possibility that the foreign matters enter from the clearance of the adhesive member 400 with respect to the vibrator 20, it might be necessary to take its countermeasure.

In such a case, for example, the prevention of invasion of the foreign matters can be realized by forming an unillustrated protecting film normally arranged on the surface of the circuit chip 200 and constructed by polyimide, etc. to be partially thick by a photolithograph technique, etc., and forming a dam so as to surround the vibrator 20 by this thick wall portion. Concretely, the dam having a shape similarly to that of the adhesive member 400 shown in FIG. 8 can be formed by this protecting film.

Second Embodiment

Figure 11:
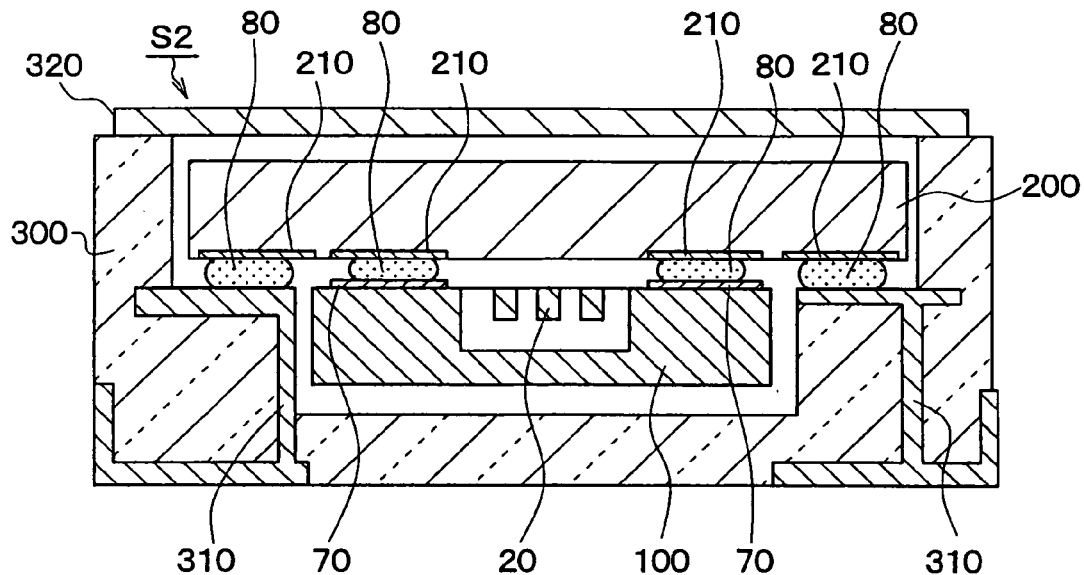
FIG. 11 is a schematic sectional view of an angular velocity sensor device as a sensor device in accordance with a second embodiment of the present invention.

FIG. 11 is a view showing an angular velocity sensor device S2 as a sensor device in accordance with a second embodiment of the present invention.

In this embodiment, as shown in FIG. 11, similarly to the above first embodiment, in the angular velocity sensor device S2, an angular velocity detecting element (sensor chip) 100 having a vibrator 20 on one surface and a circuit chip 200 are laminated and both these chips 100, 200 are electrically connected. Furthermore, the angular velocity detecting element 100 is laminated with the circuit chip 200 through bumps 80 such that its vibrator 20 is opposed to the circuit chip 200. In addition, both the chips 100, 200 are electrically connected by the bump 80, while the vibrator 20 and the circuit chip 200 are separated by a space through the bumps 80.

Here, as shown in FIG. 11, in the angular velocity sensor device S2 of this embodiment, the above-described adhesive member is not arranged between the angular velocity detecting element 100 and the circuit chip 200.

That is, the above-described adhesive member may be also omitted if mechanical connecting strength is secured by using the bumps 80 bonded between both the angular velocity detecting element 100 and the circuit chip 200.

The sensor device S2 can effectively operate the movable portion 20 and restrict the variation in parasitic capacity of an electric connecting portion of both the chips 100, 200 due to an impact, etc. as much as possible even when the adhesive member is omitted in the sensor device S2.

Even in the angular velocity sensor device S2 of this embodiment, as described in a modified example of the above first embodiment, the prevention of invasion of foreign matters can be also realized by setting the protecting film of the surface of the circuit chip 200 to be partially thick, and forming a dam by this thick wall portion.

Third Embodiment

Figure 12:
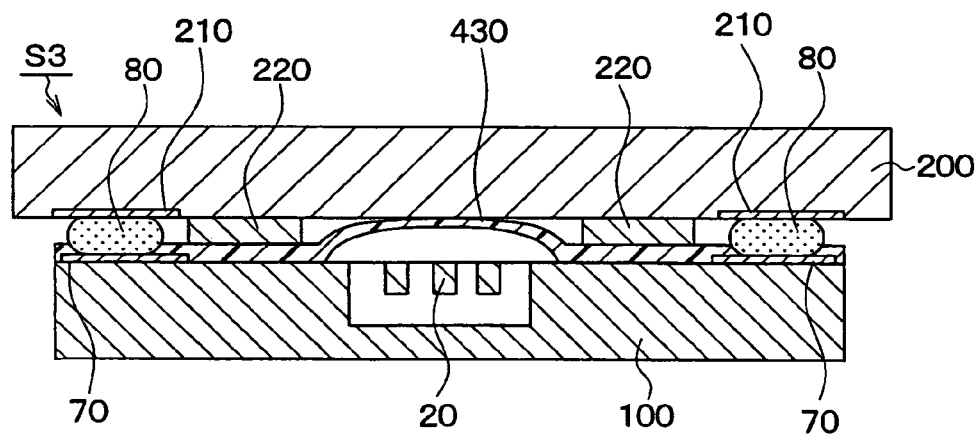
FIG. 12 is a schematic sectional view showing a part of an angular velocity sensor device as a sensor device in accordance with a third embodiment of the present invention.

FIG. 12 is a view showing a part of an angular velocity sensor device S3 as a sensor device in accordance with a third embodiment of the present invention.

In the third embodiment, as shown in FIG. 12, similarly to the above first embodiment, in the angular velocity sensor device S3, an angular velocity detecting element (sensor chip) 100 having a vibrator 20 on one surface and a circuit chip 200 are laminated and both these chips 100, 200 are electrically connected. In addition, the angular velocity detecting element 100 is laminated with the circuit chip 200 through bumps 80 in a state in which its vibrator 20 is opposed to the circuit chip 200, and both the chips 100, 200 are electrically connected by the bumps 80, and the vibrator 20 and the circuit chip 200 are separated by the bumps 80.

Further, an adhesive member 400 having an electric insulating property for adhering both these chips 100, 200 is arranged between the angular velocity detecting element 100 and the circuit chip 200, and the adhesive member 400 is separated from the vibrator 20.

In the third embodiment, a member constructed with an adhesive film having a film shape is used as the adhesive member 400, and this adhesive film constitutes a convex portion 430 convex in a direction in which a part corresponding to the vibrator 20 as the movable portion is separated from the vibrator 20 as shown in FIG. 12.

Thus, in the angular velocity sensor device S3 of this embodiment, it is possible to effectively separate the vibrator 20 and the adhesive film as the adhesive member 400 by this convex portion 430. Further, since the vibrator 20 is covered with this convex portion 430 of the adhesive member 400, the invasion of foreign matters into the vibrator 20 can be prevented.

Here, as shown in FIG. 12, this convex portion 430 can be formed by curving the adhesive film, etc. In the example shown in FIG. 12, a projecting portion 220 is formed on the circuit chip 200, and the adhesive film is curved by using this projecting portion 220 so that the convex portion 430 is formed.

For example, as mentioned above, a protecting film on the surface of the circuit chip 200 is formed to be partially thick, and this projecting portion 220 can be formed as its thick wall portion or can be also formed by using a separate adhesive film.

Fourth Embodiment

In the angular velocity sensor device of the above embodiments, a laminated member in which the angular velocity detecting element 100 and circuit chip 200 are laminated is mounted to the package 300 through the bumps 80. However, a structure not having the above package 300 may be also used as the sensor device.

That is, it is not necessary to mount the laminated member constructed by laminating the angular velocity detecting element 100 and the circuit substrate 200 into the package. For example, the laminated member may be a printed wiring board, a ceramic wiring board, etc., and electric connection using bumps may be performed.

Figure 13:
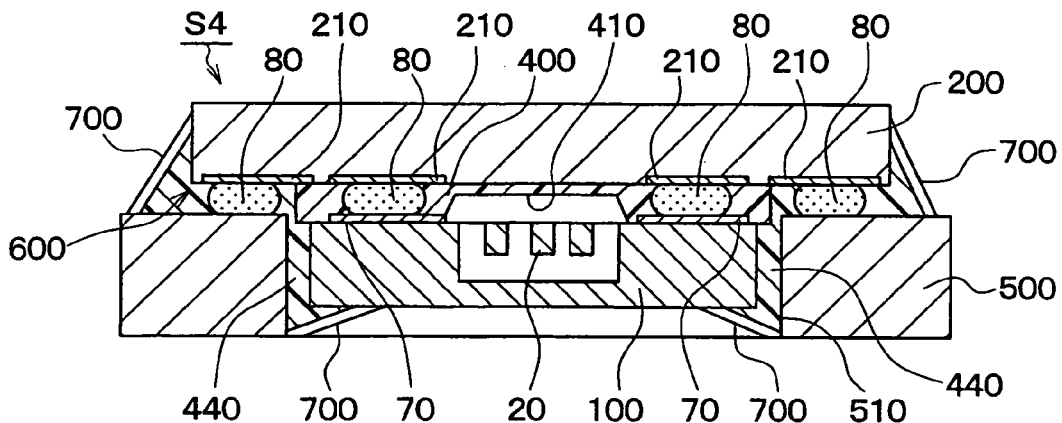
FIG. 13 is a schematic sectional view of an angular velocity sensor device as a sensor device in accordance with a fourth embodiment of the present invention.

FIG. 13 is a view showing an angular velocity sensor device S4 in accordance with the fourth embodiment of the present invention not having such a package.

Here, the laminated member of both the chips 100, 200 is mounted to a printed wiring board 500, and is constructed such that the circuit chip 200 and the printed wiring board 500 are electrically connected by using bumps 80.

Specifically, as shown in FIG. 13, a through hole 510 into which the angular velocity detecting element 100 can be inserted is provided in the printed wiring board 500, and the angular velocity detecting element 100 is inserted into this through hole 510.

Pads 210 of the circuit chip 200 and unillustrated pads of the printed wiring board 500 are electrically connected by using the bumps 80 located in the circumferential portion of the circuit chip 200 projected outside from the angular velocity detecting element 100.

Further, in the angular velocity sensor device S4 of this embodiment, the vibrator 20 as the movable portion is also surrounded and sealed by the adhesive member 400. Here, the outer circumference of the adhesive member 400 is further covered and sealed by a seal portion 600.

For example, as shown in FIG. 13, the clearance between the circuit chip 200 including the bumps 80 outside the adhesive member 400 and the printed wiring board 500, and the clearance between the angular velocity detecting element 100 and the printed wiring board 500 are filled with a sealing material 440.

The sealing material 440 is filled between the sensor chip 100 and the printed wiring board 500, and is made of a resin adhesive material such as epoxy resin, polyimide resin, etc. able to be hardened after this material is injected into an arranging space.

Further, similarly to the above first embodiment, a film formed by an adhesive film, a printing method, etc. can be adopted as the adhesive member 400 of this embodiment. In this embodiment, the seal portion 600 for sealing the movable portion 20 is constructed with these adhesive member 400 and sealing material 440.

Further, in the fourth embodiment, the surface of the seal portion 600 including this adhesive member 400 is covered with a coating material 700 for securing the seal property of the seal portion 600.

For example, an inorganic material, etc. can be used as such a coating material 700. Concretely, $Al_2O_3$ using an ALD (Atomic Layer Deposition) film forming method, and silicon nitride ($Si_3N_4$, etc.) using a low temperature catalytic CVD (Low Temperature Catalytic Chemical Vapor Deposition: briefly called CAT-CVD) method can be used as the coating material 700.

In accordance with the angular velocity sensor device S4 of this embodiment using the coating material 700, the seal property of the seal portion 600 for sealing the movable portion 20 can be improved, and the angular velocity sensor device S4 can be formed to be excellent in the invasion prevention of foreign matters, humidity resisting property, etc. In particular, the coating material 700 can be effectively used when the seal property of the seal portion 600 is insufficient in the adhesive member 400 and the seal portion 600.

In this embodiment, similarly to the above first embodiment, both the chips 100, 200 are electrically connected by using the bumps 80, while the vibrator 20 and the circuit chip 200 are separated. In addition, the adhesive member 400 is arranged between both the chips 100 and 200, and the adhesive member 400 is separated from the vibrator 20, etc.

Further, the coating material 700 can be also used for a sensor device having the package 300 as in the above embodiments. For example, in the angular velocity sensor device S1 shown in FIG. 1, the adhesive member 400 for sealing the vibrator 20 is used as a seal portion. However, a coating material can be formed on the surface of this adhesive member 400. In this case, the sealing effect can be further improved.

Fifth Embodiment

Figure 14:
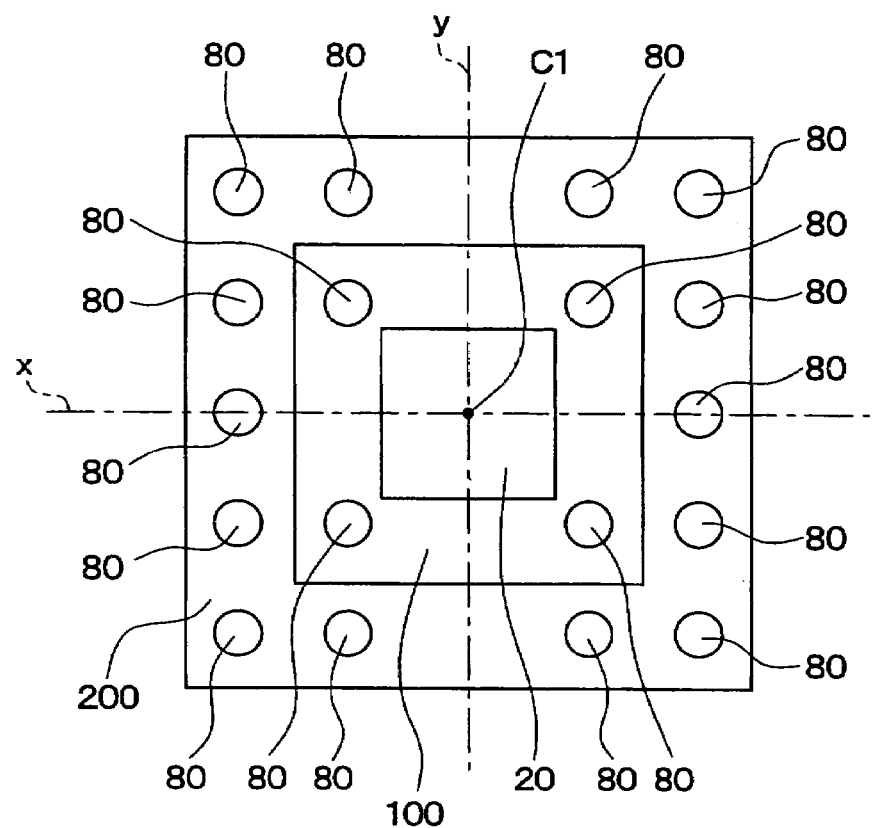
FIG. 14 is a schematic plan view showing a part of an angular velocity sensor device as a sensor device in accordance with a fifth embodiment of the present invention.
Figure 15:
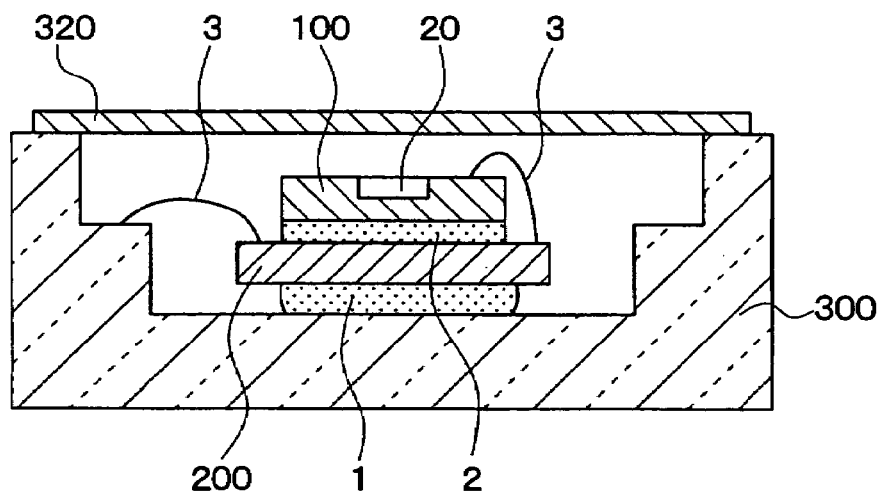
FIG. 15 is a schematic sectional view showing a sensor device constructed by laminating a sensor chip and a circuit chip in a related art.

FIG. 14 is a schematic plan view showing a part of an angular velocity sensor device in accordance with the fifth embodiment of the present invention.

In the fifth embodiment, as shown in FIG. 14, plural bumps 80 are arranged so as to form point symmetry with respect to the center C1 of a sensor chip 100. Thus, stress applied to the sensor chip 100 can be effectively reduced and an influence on sensor characteristics, etc. can be restricted.

In this example of FIG. 14, plural bumps 80 for connecting the circuit chip 200 and the package 300, i.e., plural bumps 80 located in the outer circumference of the sensor chip 100 in FIG. 14 are also arranged to be point symmetry with respect to the center C1 of the sensor chip 100.

Further, the arrangement of the bumps 80 and the structure of each portion for relaxing the stress applied to the sensor chip 100 can be used.

First, the center of the sensor chip 100 and the center of the vibrator 20 as a sensor element, i.e., the center of the above concave portion 410 are conformed. That is, the sensor chip 100 and the sensor element 20 are located in line symmetry of the x-axis and the y-axis in FIG. 14.

Further, with respect to the sensor chip 100, the bumps 80 joined to the circuit chip 200 may be arranged in line symmetry of only the x-axis, and may be also arranged in line symmetry of only the y-axis, and may be also arranged in line symmetry of the x-axis and the y-axis. Further, with respect to the sensor chip 100, the bumps 80 joined to the circuit chip 200 may be also arranged in rotation symmetry of 90 degrees.

Further, with respect to the circuit chip 200, the bump 80 joined to the package 300 may be arranged in line symmetry of only the x-axis, and may be also arranged in line symmetry of only the y-axis, and may be also arranged in line symmetry of the x-axis and the y-axis. Further, with respect to the circuit chip 200, the bumps 80 joined to the package 300 may be also arranged in rotation symmetry of 90 degrees.

Further, the planar shape of the sensor chip 100 can be desirably set to a square shape rather than a rectangular shape, and the planar shapes of the circuit chip 200 and the package 300 can be also desirably set to a square shape rather than a rectangular shape.

Other Embodiments

Although the present invention has been described in connection with some preferred embodiments thereof with reference to the accompanying drawings, it is to be noted that various changes and modifications will become apparent to those skilled in the art.

For example, with respect to the structure of the angular velocity detecting element 100 shown in FIG. 3, one example able to be applied to the angular velocity detecting element as the sensor chip of the present invention is shown, and the present invention is not limited to this example.

Further, in each of the above embodiments, the circuit chip 200 and the package 300 are electrically connected through the bumps 80. However, the circuit chip 200 and the package 300 may be also electrically connected through a bonding wire.

Further, in the above-described embodiments, after the bumps 80 and the adhesive member 400 are formed on the surface of the circuit chip 200, the angular velocity detecting element 100 as the sensor chip is laminated with the circuit chip 200 through the bumps 80. However, conversely, after the bumps 80 and the adhesive member 400 are formed on the surface of the angular velocity detecting element 100, the circuit chip 200 can be joined to the angular velocity detecting element 100.

In this case, for example, the adhesive member 400 may be arranged in the angular velocity detecting element 100 by sticking an adhesive film having the above concave portion 410 in advance, or selectively printing the adhesive member 400 except for a portion of the vibrator 20, etc.

Further, the present invention is not limited to the above-described angular velocity sensor device, but can be also applied to a sensor device in which the sensor chip having a movable portion on one surface and the circuit chip are laminated and both these chips are electrically connected.

For example, the present invention can be also applied to an acceleration sensor having a movable portion such as a movable electrode, a movable weight, etc. on one surface of the sensor chip, and a pressure sensor having a movable portion such as a diaphragm, etc.

That is, in the above-described embodiments, in a sensor device, a sensor chip having a movable portion, i.e., a sensing portion on one surface and a circuit chip are laminated and both these chips are electrically connected. In this sensor device, the sensor chip is laminated with the circuit chip through bumps such that a movable portion of the sensor chip is opposed to the circuit chip, and both the chips are electrically connected by the bumps while the movable portion, i.e., the sensing portion and the circuit chip are separated by using the bumps. The other portions can be suitably changed in structure. For example, the number of bumps can be suitably changed, and a single bump can be used.

In a sensing portion for performing detection in the sensor device, the sensing portion and the circuit chip are separated so that an appropriate operation of the sensor is secured without obstructing sensor characteristics. Further, the variation of parasitic capacity of the electric connecting portion of both the chips due to an impact, etc. can be effectively restricted by the bump-joining between both the chips.

While the invention has been described with reference to preferred embodiments thereof, it is to be understood that the invention is not limited to the preferred embodiments and structures. The invention is intended to cover various modification and equivalent arrangements. In addition, while the various elements of the preferred embodiments are shown in various combinations and configurations, which are preferred, other combinations and configuration, including more, less or only a single element, are also within the spirit and scope of the invention.

What is claimed is:

1. A sensor device comprising:
a sensor chip having a movable portion on one surface;
a circuit chip laminated with the sensor chip to be opposite to the movable portion of the sensor chip;
an adhesive member having an electric insulating property, the adhesive member being arranged between the sensor chip and the circuit chip for bonding both the sensor chip and the circuit chip, and the adhesive member being separated from the movable portion of the sensor chip and being constructed with an adhesive film, the adhesive film having a first portion opposite to the movable portion and a second portion positioned outside from the first portion, and the first portion of the adhesive film being made thinner than the second portion of the adhesive film to form a concave portion recessed from a surface on a side of the movable portion; and
a bump located between the sensor chip and the circuit chip,
wherein the sensor chip and the circuit chip are electrically connected through the bump, and the movable portion of the sensor chip is separated from the circuit chip by a space using the bump.

2. The sensor device according to claim 1, wherein the adhesive member is arranged around the bump and seals the bump.

3. The sensor device according to claim 1, wherein:
the adhesive member is arranged to surround the movable portion between the sensor chip and the circuit chip; and
the movable portion positioned at an inner peripheral side of the adhesive member is sealed by the adhesive member.

4. The sensor device according to claim 1, wherein the adhesive film is formed by a printing.

5. The sensor device according to claim 1, wherein the adhesive member is provided to form a seal portion for sealing the movable portion around the movable portion, the sensor device further comprising a coating member which covers the seal portion.

6. The sensor device according to claim 1, wherein the bump includes a plurality of bump parts which are arranged in point-symmetry with respect to a center of the sensor chip.

7. The sensor device according to claim 1, wherein the bump includes a plurality of bump parts which are separately arranged around the movable portion.

8. The sensor device according to claim 7, wherein:
the adhesive member is arranged around the movable portion of the sensor chip.

9. The sensor device according to claim 8, wherein the bump parts are located in an area where the adhesive member is arranged.

10. The sensor device according to claim 8, wherein the adhesive member is located outside of the bump parts to surround the bump parts.

11. The sensor device according to claim 8, wherein:
the adhesive member includes a plurality of adhesive parts which are arranged around the movable portion; and
the adhesive parts are arranged to surround the bump parts, respectively.

12. The sensor device according to claim 8, wherein:
the adhesive member includes a plurality of adhesive parts which are arranged around the movable portion; and
the adhesive parts are arranged at positions different from the bump parts, respectively.

13. The sensor device according to claim 1, further comprising
a package having a space in which the circuit chip and the sensor chip are located; and
an additional bump through which the circuit chip is electrically connected to an electrical portion of the package.

14. A sensor device comprising:
a sensor chip having a movable portion on one surface;
a circuit chip laminated with the sensor chip to be opposite to the movable portion of the sensor chip;
an adhesive member having an electric insulating property, the adhesive member being arranged between the sensor chip and the circuit chip for bonding both the sensor chip and the circuit chip, and the adhesive member being separated from the movable portion of the sensor chip and being constructed with an adhesive film, the adhesive film having a convex portion protruding in a direction separating from the movable portion; and
a bump located between the sensor chip and the circuit chip,
wherein the sensor chip and the circuit chip are electrically connected through the bump, and the movable portion of the sensor chip is separated from the circuit chip by a space using the bump.

15. The sensor device according to claim 14, wherein the adhesive member is arranged around the bump and seals the bump.

16. The sensor device according to claim 14, wherein:
the adhesive member is arranged to surround the movable portion between the sensor chip and the circuit chip; and
the movable portion positioned at an inner peripheral side of the adhesive member is sealed by the adhesive member.

17. The sensor device according to claim 14, wherein the adhesive film is formed by a printing.

18. The sensor device according to claim 14, wherein the adhesive member is provided to form a seal portion for sealing the movable portion around the movable portion, the sensor device further comprising a coating member which covers the seal portion.

19. The sensor device according to claim 14, wherein the bump includes a plurality of bump parts which are arranged in point-symmetry with respect to a center of the sensor chip.

20. The sensor device according to claim 14, wherein the bump includes a plurality of bump parts which are separately arranged around the movable portion.

* * * * *